US009506950B2

(12) United States Patent
Ramirez

(10) Patent No.: US 9,506,950 B2
(45) Date of Patent: Nov. 29, 2016

(54) TAMPERING DETECTION FOR AN ELECTRIC METER

(71) Applicant: Landis+Gyr, Inc., Lafayette, IN (US)

(72) Inventor: Anibal Diego Ramirez, Indianapolis, IN (US)

(73) Assignee: Landis+Gyr, Inc., Lafayette, IN (US)

( * ) Notice: Subject to any disclaimer, the term of this patent is extended or adjusted under 35 U.S.C. 154(b) by 318 days.

(21) Appl. No.: 14/215,445

(22) Filed: Mar. 17, 2014

(65) Prior Publication Data

US 2015/0260759 A1    Sep. 17, 2015

(51) Int. Cl.
| | |
|---|---|
| *G01R 11/24* | (2006.01) |
| *G06Q 50/06* | (2012.01) |
| *G01R 29/08* | (2006.01) |
| *G01R 22/06* | (2006.01) |

(52) U.S. Cl.
CPC ............. *G01R 11/24* (2013.01); *G01R 22/066* (2013.01); *G06Q 50/06* (2013.01)

(58) Field of Classification Search
CPC .... G01R 11/24; G01R 29/08; G01R 22/066; G01R 22/06; G06Q 50/06
See application file for complete search history.

(56) References Cited

U.S. PATENT DOCUMENTS

| | | | |
|---|---|---|---|
| 4,278,940 A | 7/1981 | Milkovic | |
| 4,707,679 A | 11/1987 | Kennon et al. | |
| 5,086,292 A | 2/1992 | Johnson et al. | |
| 7,432,823 B2 | 10/2008 | Soni | |
| 7,495,555 B2 | 2/2009 | Seal et al. | |
| 8,134,346 B1 | 3/2012 | Huta et al. | |
| 8,352,191 B2 | 1/2013 | McAhren | |
| 8,373,394 B1 | 2/2013 | Huta et al. | |
| 9,121,883 B2 | 9/2015 | Ramirez | |
| 2003/0151415 A1 | 8/2003 | Randall | |
| 2004/0021568 A1 | 2/2004 | Seal et al. | |
| 2005/0035914 A1 | 2/2005 | Winter | |
| 2005/0194962 A1 | 9/2005 | Briese et al. | |
| 2009/0001964 A1 | 1/2009 | Strzalkowski | |
| 2009/0073738 A1 | 3/2009 | Lenssen | |
| 2010/0023174 A1 | 1/2010 | Nagata et al. | |
| 2010/0036624 A1* | 2/2010 | Martin | G01R 22/10 702/61 |

(Continued)

OTHER PUBLICATIONS

Government of Arunachal Pradesh Department of Power: Bid Document Part-III (Volume-2/3); Automation of Electric Energy Metering and Billing With AMR and Pre-Paid Meters in Capital Complex 11, XP055148020, Jun. 27, 2013, pp. 1-86.

(Continued)

*Primary Examiner* — Patrick Assouad
*Assistant Examiner* — Haidong Zhang
(74) *Attorney, Agent, or Firm* — Maginot, Moore & Beck LLP

(57) ABSTRACT

A tamper detection system for an electricity meter includes an antenna, an RF signal level circuit, and a controller. The antenna is configured to receive an RF signal. The RF signal level circuit is supported within an electricity meter housing and is operatively connected to the antenna. The RF signal level circuit is configured to detect the RF signal received by the antenna and to provide a strength signal corresponding to a magnitude of the RF signal. The controller is supported within the electricity meter housing, and is operatively connected to the RF signal level circuit. The controller is configured to generate an RF signal strength value based at least in part on the strength signal, and to generate a tamper flag responsive at least in part to a determination that the RF signal strength value exceeds a threshold value.

14 Claims, 3 Drawing Sheets

(56) References Cited

U.S. PATENT DOCUMENTS

| | | |
|---|---|---|
| 2010/0072990 A1 | 3/2010 | Edwards |
| 2010/0187914 A1 | 7/2010 | Rada et al. |
| 2010/0283452 A1 | 11/2010 | Voisine |
| 2011/0193569 A1* | 8/2011 | AlRawi ............ H03B 5/36 324/652 |
| 2012/0078428 A1 | 3/2012 | Henderieckx |
| 2012/0078546 A1 | 3/2012 | Mancuso et al. |
| 2012/0092177 A1 | 4/2012 | Kuystermans |
| 2012/0130681 A1 | 5/2012 | Pride |
| 2012/0150462 A1 | 6/2012 | Voisine |
| 2013/0063280 A1 | 3/2013 | Pamulaparthy |
| 2013/0088353 A1 | 4/2013 | LaFrance |
| 2013/0093418 A1 | 4/2013 | Ramirez |
| 2015/0002134 A1 | 1/2015 | Ramirez |

OTHER PUBLICATIONS

Bhutan Power Corporation Limited: Addendum 211, XP055148039, Aug. 2011, pp. 1-13, http://www.bpc.bt/wp-content/downloads/2011/B20/Addendum2.pdf.

Glenn A. Pritchard, Analytics in Action, Metering International, XP002731435, Oct. 2012, pp. 120-124, http://www.metering.com/wp-content/uploads/2013/10/MI-3-2012a.pdf.

Rajesh M Bansal, Maximizing the Benefits of AMR for Theft Detection Through Data Analytics, XP055148045, Jul. 2007, pp. 1-33, http://www.metering.com/wp-content/uploads/RajeshFINALO.pdf.

International Search Report for PCT Patent Application No. PCT/US2014/044753, Nov. 7, 2014.

* cited by examiner

TAMPERING DETECTION FOR AN ELECTRIC METER

TECHNICAL FIELD

This invention relates generally to electric meters, and more particularly to a tamper detector for an electronic utility meter.

BACKGROUND

Electric utility meters can be susceptible to external interference. Specifically, electronic electricity meters include highly accurate electronic devices which can be adversely affected by exposure to physical interference or by exposure to electronic interference. Such interference can result in inaccurate energy metering.

In some situations, the interference results from unintended and/or misdirected sources such as weather conditions or power line abnormalities. In other situations, however, the interference is intended and/or malicious and is intended to alter the readings of electricity consumption being made and reported. One example of such tampering include those that employ magnetic interference with meter circuitry. Magnetic tampering can consist of placing a powerful magnet on the outside of the sealed meter housing. If the magnet is placed properly, then the operation of the current sensing elements within the meter can be adversely affected, resulting in artificially low energy consumption measurements. Altering the accuracy of a meter to reduce the meter measurements constitutes a form of energy theft, and is undesirable.

The susceptibility of meters to such magnetic interference has spawned interest in electrical utilities in the detection of unusually high magnetic fields within utility meters. Various solutions have been proposed including those disclosed in United States Patent Publication No. 2013/0093418, which is assigned to the assignee of the present invention and is incorporated herein by reference. Similarly, arrangements for detecting other modes of tampering have been developed.

As meters become more sophisticated and incorporate newer technologies, there can be new vulnerabilities to tampering in ways that were previously not possible with older meters. As a consequence, there is a need to diligently anticipate and formulate detection mechanisms for new potential types of tampering.

SUMMARY

The disclosure provides a method for detecting the presence and strength of external RF fields that may affect the accuracy of an electricity meter, and particularly in an electronic electricity meter. The present disclosure introduces a system and method to detect the presence of an external RF field that can be used to disrupt the meter operation and billing information generated by or within the meter.

In one or more of the present embodiments, the occurrence of RF interference directed to an electrical utility meter is monitored and identified. In some embodiments, the proposed utility meter transmits a signal to a receiver, often located at a utility company, indicating that a utility meter has experienced the application of an external RF signal.

In one embodiment, a tamper detection system for an electricity meter includes an antenna, an RF signal level circuit, and a controller. The antenna is configured to receive an RF signal. The RF signal level circuit is supported within an electricity meter housing and is operatively connected to the antenna. The RF signal level circuit is configured to detect the RF signal received by the antenna and to provide a strength signal corresponding to a magnitude of the RF signal. The controller is supported within the electricity meter housing, and is operatively connected to the RF signal level circuit. The controller is configured to generate an RF signal strength value based at least in part on the strength signal, and to generate a tamper flag responsive at least in part to a determination that the RF signal strength value exceeds a threshold value.

In still another embodiment, there is provided a method for detecting tampering of an electricity meter. The method includes: receiving an RF signal at the electricity meter; generating an RF signal strength value representative of a strength of the received RF signal; determining whether the RF signal strength value indicates the receipt of an undesired RF signal; and providing a tamper flag responsive at least in part to determining that the RF signal strength value indicates the receipt of the undesired RF signal.

In yet another embodiment, there is provided an electronic utility meter having an antenna configured to receive an RF signal and an RF signal level circuit, operatively connected to the antenna. The RF signal level circuit is configured to detect the RF signal and to provide a strength signal corresponding to a magnitude of the RF signal received by the antenna. A processing circuit is operatively connected to the RF signal level circuit. The processing circuit is configured: to compare an RF signal strength value to a threshold value, the RF signal strength value having a value corresponding to the strength signal; to provide a tamper flag representative of the level of the strength signal responsive to a result of the comparison; and to perform at least one operation of the electronic utility meter.

The above described features and advantages, as well as others, will become more readily apparent to those of ordinary skill in the art by reference to the following detailed description and accompanying drawings.

DESCRIPTION

Figure 1:
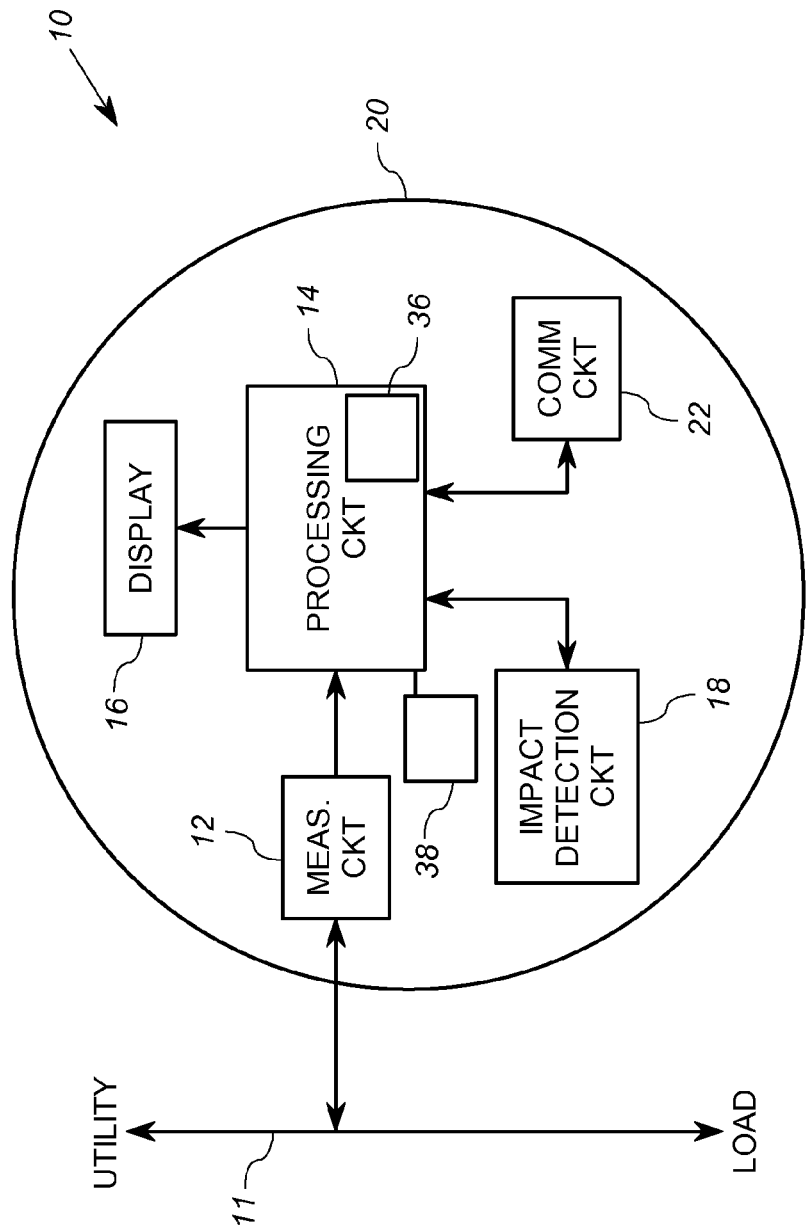
FIG. 1 illustrates a schematic block diagram of a meter incorporating a tamper detection circuit according to an exemplary embodiment of the invention.

FIG. 1 illustrates an exemplary electricity meter 10 that incorporates an arrangement for detection according to the invention. The electricity meter 10 is coupled to a utility through a power line 11 and includes a measurement circuit 12, a processing circuit 14, a display 16, and a tamper detection circuit 18, which are disposed within a housing 20 of the electricity meter. In this embodiment, the electricity meter 10 further includes a communication circuit 22. In one embodiment, the electricity meter is a poly-phase electronic utility meter.

The measurement circuit 12 includes voltage and/or current sensors, analog to digital conversion circuitry, and other circuitry configured to generate digital measurement and/or energy signals from power line 11. Such circuits for electronic meters are well known in the art. The processing circuit 14 is a circuit that performs control functions of the meter 10, and in many cases, performs further processing on the digital measurement signals generated by the measurement circuit 12. For example, the processing circuit 14 may convert raw digital measurement information received from the measurement circuit 12 into a format that is displayable, or convert energy information to derivative types of energy consumption information, such as those related to time of use and the like. To this end, the processing circuit 14 is operably coupled to the measurement circuit 12, to the display 16, to the tamper detection circuit, and the communication circuit 22. It will be appreciated that the exact physical configuration of the measurement circuit 12 and the processing circuit 14 is not important to the implementation of the invention, and this embodiment of the invention may be used in a wide variety of meters that include digital processing circuitry. While the processing circuit 14 includes the specific additional functionality related to tamper detection described herein, it may otherwise include known processing circuit structures and functionalities. Suitable embodiments of the measurement circuit 12 and such a processing circuit are described, for example, in U.S. patent applications, Ser. No. 12/777,244 filed May 10, 2010, Ser. No. 12/537,885, filed Aug. 7, 2009, and Ser. No. 12/652,007, filed Jan. 4, 2010.

The display 16 in this embodiment is an LCD display 16 that provides visible display of information as controlled by the processing circuit 14. To this end, the LCD display 16 is operably coupled to receive information to be displayed from the processing circuit 14. Such display devices are known in the art and may take many forms.

The tamper detection circuit 18 is includes a tamper detector and corresponding circuitry capable, in different embodiments, of detecting, recording, and date-stamping detected radio frequency field signals. In this embodiment, the tamper detection circuit 18 is operably connected to provide tamper event detection information to the processing circuit 14. To this end, as will be discussed below in connection with FIG. 2, the processing circuit 14 in this embodiment includes a tamper controller function 36 that causes the processing circuit 14, at least in part, to perform processing operations for the tamper detection arrangement. In practice, the tamper controller function 36 may suitably be a set of operations stored in a memory in the processing circuit 14 and performed from time to time by the processing circuit 14.

It will be appreciated that the meter 10 may also employ additional tamper detections circuits and features directed to detecting other forms of tampering, such as meter cover removal detection, magnetic field detection, shock detection and the like.

The communication circuit 22 is a circuit configured to communicate via optical communication or other ports on the meter 10. As is known in the art, the processing circuit 14 is operably connected to communicate data to and from external devices via the communication circuit 22. In some embodiments, the communication circuit 22 includes a circuit that is operable to communicate information with remote devices over a wireless network, or over the power lines. In other embodiment, the communication circuit 22 is an automatic meter reading (AMR) circuit that automatically collects use data, diagnostic data, and status data for transmission to a database often located at a utility company. AMR circuits in different embodiments, transmit data through wired or wireless communication channels, radio frequency transmission, or powerline transmission.

In general, the meter 10 when installed (i.e. connected to utility power lines) measures and records data representative of energy consumption, or similar values. To this end, the measurement circuit 12 generates measured values representative of quantities of energy consumed delivered to a load being monitored over the power lines 11. The processing circuit 14 receives and further processes the measured values to generate displayable or transmittable energy consumption values. The processing circuit 14 and causes the display 16 to display information related to measured energy consumption. The processing circuit 14 may also cause the information related to measured energy consumption to be communicated to remote or other external devices via the communication circuit 22.

As will be discussed below in connection with FIGS. 2 and 3, the tamper detection circuit 18 and the tamper controller function 36 of the processing circuit 14 form a tamper detection arrangement that operates to monitor the presence of RF energy that exceeds a predetermined threshold directed at the meter 10. The monitoring operation, in different embodiments, occurs during installation of the meter 10 at an installation site and/or during normal metering operations. In the event of a detected RF field energy above a predetermined threshold, the tamper detection circuit 18 cooperates with the controller 36 to store in memory a value representative of the magnitude of an RF signal representative of the detected RF field energy. In some embodiments, a record of the date and time of the occurrence of an excessive RF signal is made. The processing circuit 14 generates a record of one or more of the RF signals related to a detection event and provides information indicative of the event for display on the display 16. Alternatively, or in addition, the processing circuit 14 causes information indicative of the event to be communicated via the communication circuit 22 to an external device, not shown, but which could be a portable or central computing system of the utility service provider, and/or for access by a reader and/or reading device.

Figure 2:
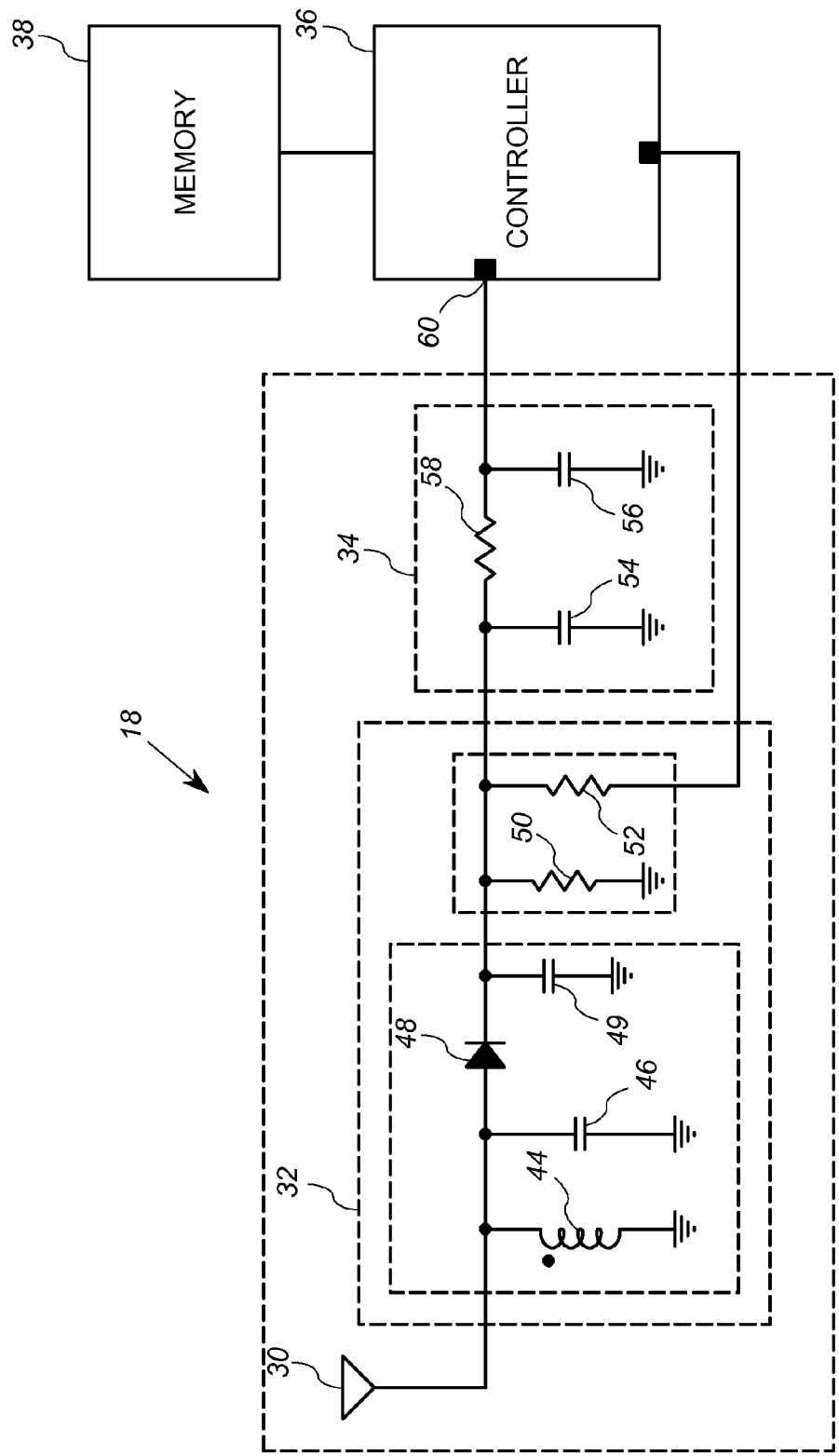
FIG. 2 illustrates in further detail a tamper detection circuit.

FIG. 2 shows a schematic diagram of one embodiment of the tamper detection circuit 18 of FIG. 1, shown in context with the controller function 36 of the processing circuit 14, and a memory 38. The detection circuit 18 includes an antenna 30, an RF signal level circuit 32, and an RF filter circuit 34. In one embodiment, the antenna 30 is a wide band RF antenna that is configured to detect signals within a frequency band of approximately 400 MZ to 2.5 GHz. The antenna 30 is located on or in the meter housing 20 and in one embodiment is located in the electricity meter electronics assembly. The location of the antenna 30 is arranged to provide adequate detection of an external RF signal which can affect the meter electronics, particularly the more RF sensitive electronics. To this end, the antenna 30, in different embodiments, is a part of the meter electronics circuit board, an integrated antenna, or an inductor/capacitor pick up. While a wide band RF antenna is particularly advantageous, it will be appreciated that other embodiments need not necessarily include a wide band antenna, such as in the case of a meter having a known, narrower band of RF interference susceptibility.

The RF signal level circuit 32 is a circuit operatively coupled to receive any RF signal detected by the antenna 30, and to produce a strength signal therefrom. To this end, the RF signal level circuit 32 in this embodiment includes an RF peak detector circuit 40 and a discharge circuit 42. The circuit 40 includes an inductor 44 connected in parallel with a capacitor 46 each of which is coupled to a diode 48. The inductor 44 and the capacitor 46 are configured to tune the antenna 30 to a desired range of signal frequencies received by the antenna 30. The diode 48, in one embodiment, is a high frequency diode which in combination with a capacitor 49 provides for RF peak detection of the received RF signal. The peak detector 40 is a circuit configured to generate a direct current (DC) component of the RF signal (received by the antenna 30) which is proportional to the strength of the sensed RF signal. A value of the RF signal sensed by the peak detector 40 is controlled by the discharge circuit 42 which includes a resistor 50 and 52 arranged in parallel. The resistor 52 is operatively coupled to the controller 36 which is programmed to adjust the voltage across the resistor 52. Consequently, the discharge constant for the signal level circuit 32 is programmable to provide an RF signal peak detection value. In any event the peak detected signal or strength signal is provided to the RF filter circuit 34.

In particular, the RF filter circuit 34 is a low pass filter operably coupled to receive the strength signal from the signal level circuit 32 and generate a filtered strength signal therefrom. The RF filter circuit 34 is operably coupled to provide the filtered strength signal to the controller 36. To this end, the RF filter circuit 34 is coupled between the discharge circuit 42 and the controller 36.

The RF filter circuit 34 includes a capacitor 54, a capacitor 56 and a resistor 58 coupled there between. The RF filter circuit 34 operates as a low pass filter to eliminate an RF component from the output of the discharge circuit 42 which provides the peak detected signal of the RF signal. The filtered peak detected signal (i.e. the filtered strength signal) is transmitted to the controller 36 which is configured to convert the filtered peak detected signal (strength signal) to a digital RF signal. In one embodiment, the controller 36 includes an analog-to-digital (A/D) converter configured to provide the conversion.

Thus, the controller function 36 (of the processing circuit 14 of FIG. 1) is operably coupled to receive the strength signal from the RF filter circuit 34, and is further operably coupled to a memory 38. As discussed above, the controller function 36 in this embodiment is configured as part of the processing circuit 14 as illustrated in FIG. 1. In another embodiment, the controller 36 is separate from the processing circuit 14, for example, part of another processor or control device within the meter 10. The memory 38, in one embodiment, is a device separately located outside the processing circuit 14. In other embodiments, the memory 38 is part of the processing circuit 14 or is part of the controller 36.

In one exemplary embodiment the values of the components of FIG. 2 are as follows:

Inductor 44: 10 micro henrys
Capacitor 46: 22 pico farads
Diode 48: high frequency
Capacitor 49: 22 pico farads
Resistor 50: 1 mega ohm
Resistor 52: 100 kohms
Capacitor 54: 330 pico farads
Capacitor 56: 330 pico farads
Resistor 58: 10 kohms.

The memory 38 is configured to store a predetermined threshold value which has been selected for comparison to the digital RF signal that represents the filtered strength signal. A memory access operation of the controller 36 fetches the threshold value and compares the threshold value to the digital RF signal. In one embodiment, if the digital RF signal exceeds the threshold value, the controller 36 sets an indicator which represents that an "excessive RF signal" has been sensed by the RF signal level circuit 32. The controller 36 sets an excessive RF signal flag in memory 38 as the indicator which includes a corresponding time stamp. In another embodiment, the flag includes a corresponding time stamp and a duration value representing a period of time in which the RF signal exceeded the threshold value. In still another embodiment, if the digital RF signal exceeds the threshold value, the controller 36 time stamps the digital RF signal and compares the time stamp to a time stamp of another RF signal, such as an RF signal legitimately transmitted to, or from, the meter 10. This feature may be used to allow the tamper detection arrangement to "ignore" high strength RF signals when those signals are generated by the meter itself (for example, for AMR purposes), or by an external device that is legitimately being used to communicate with the meter 10.

In one embodiment, the controller 36 includes the memory 38 and both are standalone devices which are distinct from the processing circuit 14. In this embodiment, the tamper detection circuit 18 is a standalone device which can be used to retrofit existing meters 10. In another embodiment, the controller 36 and the memory 38 are included as a part of the processing circuit 14 which includes a microprocessor configured to provide all of the functions for the meter 10 and the functions of the tamper detection circuit 18. In one or more embodiments, programmed instructions reside in the microprocessor or the memory associated therewith.

The controller 36, in different embodiments, includes one or more processors (e.g. microprocessors), and the memory 38 includes random access memory (RAM) devices comprising the main memory storage of the controller 36, as well as any supplemental levels of memory, e.g., cache memories, non-volatile or backup memories (e.g. programmable or flash memories), read-only memories, etc.

The tamper detection circuit 18 is operatively connected to the communication circuit 22, which as described above, provides for the transmission of data to and from external devices.

It will be appreciated that in some embodiments, the communication circuit 22 includes an RF transmitter for the purposes of transmitting, among other things, energy consumption information to external devices. In some instances, the RF tamper detection arrangement may actually detect an RF signal being transmitted by (or to) the communication circuit 22. To insure that the detection circuit 18 does not identify or flag a legitimately transmitted RF signal as part of an excessive or tamper RF signal event, the controller 36 obtains the time stamp of the legitimate transmission by the communication circuit 22, which is available from the processing circuit 14, and compares that time stamp to a time stamp of an excessive RF signal that exceeds the stored threshold. If the time stamp comparison indicates that the detected RF signal was actually generated within the meter 10 (or by a device legitimately communicating with the meter 10), then the controller 36 does not record a tamper (or excessive RF signal) event based on the detected RF signal.

In another embodiment, the detection circuit 18 further includes an optional controllable switch 61, not shown, controlled by the controller 36. The controller 36 monitors the RF transmissions of the communication circuit 22, and operates to open the controllable switch 61 such that no signal appears at the input 60 to the controller 36 during the time of transmission by the communication circuit 22. The controller 36 may also monitor the communication circuit 22 to ensure that the switch 61 is open whenever the communication circuit 22 is receiving legitimate communication signals (signals intended to exchange data with the communication circuit 22) from an external source.

Figure 3:
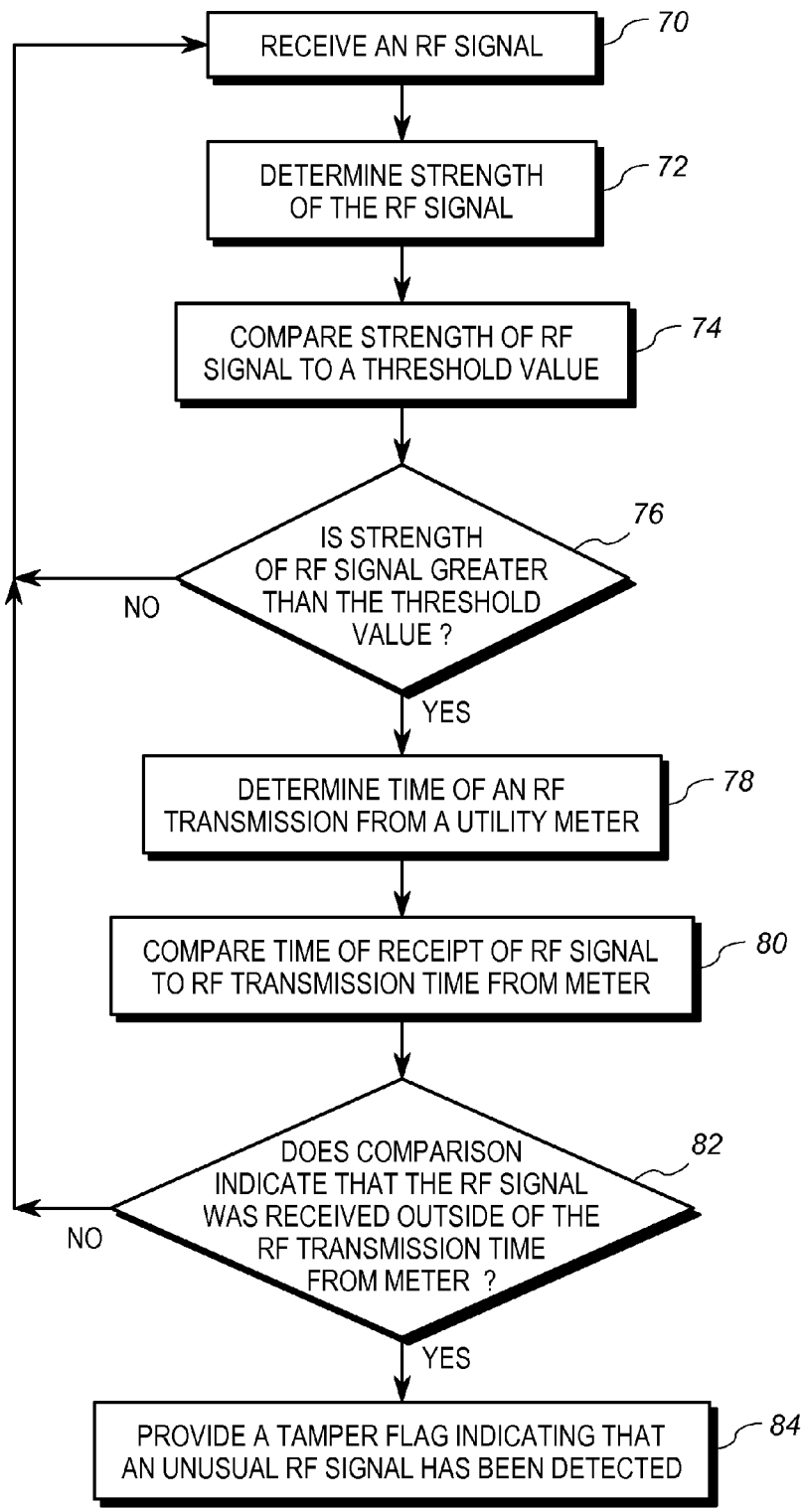
FIG. 3 illustrates in flow diagram for a set of operations including a method according to an embodiment of the invention.

Referring now to FIG. 3, a flow diagram of the operation of one embodiment of the meter 10 is illustrated. In step 70, an RF signal is received by the antenna 30. Once received, the strength of the RF signal is determined, as determined at step 72 by the RF signal level circuit 32. The controller 36 then compares the determined strength to a threshold value at step 74. If the determined strength is less than the threshold (step 76), then the RF signal level circuit 32 returns to receive and to process any RF signals at steps 70, 72, and 74. No excessive RF signal event is recorded.

If, however, the strength of the RF signal is greater than the threshold value (step 76), then the controller 36 obtains a time stamp, or other evidence of recent or current RF transmissions from the meter 10, at step 78. At step 80, the controller 36 determines whether the RF signal corresponds to a legitimate communication signal to or from the meter. In one example, the controller 36 compares the time of receipt of the RF signal to the time of the recent or current RF transmission of the meter as determined at step 78.

If the comparison at step 80 indicates that the RF signal was not received outside of a legitimate RF transmission time (step 82), then the RF signal level circuit 32 continues to monitor the occurrence of an RF signal received through the antenna 30. If, however, the comparison at step 80 indicates that the RF signal was received outside of the RF transmission time, then the controller 36 generates a tamper flag indicating that an unusual RF signal has been detected (step 84). In one embodiment, the tamper flag is provided to the meter communication circuit 22 at the time of determination for external transmission. In another embodiment, the tamper flag is stored in the memory 38 and communicated externally at a predetermined time. In still other embodiments, the controller 36 recognizes the existence of the tamper flag and provides one or more of: an indication of tampering to the display 16, an indication of tampering to the memory 38 which can be accessed by an external reader when the meter is read, and an indication of tampering to the communication circuit 22 which in turn transmits a signal indicating the existence of tampering.

While the present embodiment, is directed to monitoring an RF transmission from the same meter which includes the RF signal level circuit, in another embodiment, where a plurality of meters are located side by side, each the plurality meters are configured to monitor RF transmissions not only from within the same meter but also from one or more of the adjacently located meters. In one or more of the embodiments, the adjacently located meters are configured to share information regarding the time or times of an RF transmission among one or more of the meters. In another embodiment, one controller in a single one of the meters is configured to provide the comparing features of the described embodiments.

It will be appreciated that the exact sequence of events shown in FIG. 3 is shown by way of example only. Such steps may be performed in another order, or may be driven by interrupts such that the order is not predetermined. Those of ordinary skill in the art may readily devise other process flows to carry the same operations.

Thus, the above embodiment provides an RF signal detector that provides time stamped RF signals which are externally directed to the meter. It will be appreciated that various modifications of the RF signal detection circuit 18 of FIG. 2 may be implemented.

The above describe embodiments are merely exemplary. Those of ordinary skill in the art may readily devise their own implementations and modifications that incorporate the principles of the present invention and fall within the spirit and scope thereof. For example, it will be appreciated that similar systems, devices, and processes may be employed in a water or gas meter, if such meter includes electronic circuitry.

What is claimed is:

1. A tamper detection system for an electricity meter, comprising:
   an antenna configured to receive an RF signal;
   an RF signal level circuit supported within an electricity meter housing and operatively connected to the antenna, the RF signal level circuit configured to detect the RF signal and to provide a strength signal corresponding to a magnitude of the RF signal received by the antenna;
   a controller supported within the electricity meter housing, operatively connected to the RF signal level circuit, the controller configured to:
      generate an RF signal strength value based at least in part on the strength signal;
      generate a tamper flag responsive at least in part to a determination that the RF signal strength value exceeds a threshold value;
   wherein the RF signal level circuit includes RF peak detector circuit operatively connected to the antenna, the RF peak detector circuit configured to provide a signal component of the RF signal; and
   wherein the RF signal level circuit includes a discharge circuit operatively connected to the RF peak detector circuit and configured to receive the component of the RF signal, wherein the discharge circuit is configured to provide the strength signal.

2. The tamper detection system of claim 1, further comprising an RF filter circuit interposed between the discharge circuit and the controller, wherein the RF filter circuit is configured to remove an RF component from the strength signal prior to being compared at the controller.

3. The tamper detection system of claim 1, further comprising a memory operatively connected to the controller and configured to store the tamper flag responsive at least in part to a determination that the RF signal strength value exceeds a threshold value.

4. The tamper detection system of claim 3, further comprising a communication circuit operatively connected to the memory, wherein the controller is further configured to generate the tamper flag by causing the communication circuit to transmit the stored tamper flag external to the electricity meter.

5. The tamper detection system of claim 4, wherein the memory is configured to store programmed instructions; and
   wherein the controller is configured to execute the programmed instructions stored in the memory.

6. The tamper detection system of claim 5, wherein the controller includes an analog to digital converter configured to convert the strength signal to a digital signal for comparison to the threshold value.

7. The tamper detection system of claim 1, wherein the discharge circuit comprises a first resistor operably coupled between the RF peak detector circuit and ground.

8. The tamper detection system of claim 1, wherein the controller is configured to provide a control signal to the discharge circuit, wherein the control signal adjusts a configuration of the strength signal.

9. The tamper detection system of claim 8, wherein the discharge circuit comprises a first resistor operably coupled between the RF peak detector circuit and ground, and a second resistor operably coupled to the RF peak detector circuit, the second resistor further operatively coupled to receive the control signal from the controller.

10. The tamper detection system of claim 8, further comprising a memory operatively connected to the controller and configured to store the tamper flag responsive at least in part to a determination that the RF signal strength value exceeds a threshold value.

11. The tamper detection system of claim 10, further comprising a communication circuit operatively connected to the memory, wherein the controller is further configured to generate the tamper flag by causing the communication circuit to transmit the stored tamper flag external to the electricity meter.

12. The tamper detection system of claim 11, wherein the memory is configured to store programmed instructions; and
   wherein the controller is configured to execute the programmed instructions stored in the memory.

13. The tamper detection system of claim 12, wherein the controller includes an analog to digital converter configured to convert the strength signal to a digital signal for comparison to the threshold value.

14. The tamper detection system of claim 13, wherein the discharge circuit comprises a first resistor operably coupled between the RF peak detector circuit and ground, and a second resistor operably coupled to the RF peak detector circuit, the second resistor further operatively coupled to receive the control signal from the controller.

* * * * *